United States Patent [19]

Levy et al.

[11] 4,127,829

[45] Nov. 28, 1978

[54] FAIL-SAFE POWER COMBINING AND SWITCHING NETWORK

[75] Inventors: Ralph Levy, Newton; Paul T. K. Young, Westwood, both of Mass.

[73] Assignee: Microwave Development Labs. Inc., Needham Heights, Mass.

[21] Appl. No.: 781,684

[22] Filed: Mar. 28, 1977

[51] Int. Cl.[2] .......................... H01P 1/10; H01P 5/04; H03H 7/48

[52] U.S. Cl. .......................................... 333/2; 325/158; 330/124 D; 333/10

[58] Field of Search .................... 333/7 R, 7 D, 10, 6, 333/2; 330/124 D; 307/219; 325/168, 158

[56] References Cited

U.S. PATENT DOCUMENTS

| | | | |
|---|---|---|---|
| 2,848,688 | 8/1958 | Fraser | 333/10 X |
| 3,008,097 | 11/1961 | Tetenbaum et al. | 333/10 X |
| 3,801,932 | 4/1974 | Goldie | 333/7 R X |

*Primary Examiner*—Paul L. Gensler

*Attorney, Agent, or Firm*—Wolf, Greenfield & Sacks

[57] ABSTRACT

Under non-fault conditions the power from two equal power transmitters A and B having a relative phasing of 90° is combined in the network of this invention to provide at an output thereof a power of A + B. The network preferably comprises two 3db short-slot 90° couplers connected in cascade with the first coupler normally operating and the second coupler shorted or decoupled in the coupling slot region by means of shorting posts or the like. If transmitter B fails this condition is sensed and the second coupler has its associated decoupling means withdrawn so that the couplers form a zero db cross-over coupler delivering the total power of transmitter A to the output. For a failure condition of transmitter A a decoupling means is also associated with the first coupler so the entire network can be decoupled delivering the total power of transmitter B to the output under that condition. With a failure of either transmitter A or B there is the possibility of inoperation of the decoupling means. Under this condition the network is fail-safe with half of the available power from the operative transmitter being delivered to the output with the network still being matched.

4 Claims, 7 Drawing Figures

FAIL-SAFE POWER COMBINING AND SWITCHING NETWORK

FIELD OF THE INVENTION

The present invention pertains in general to an electro-magnetic energy coupling network preferably of waveguide construction and is concerned, more particularly, with a fail-safe power combining and switching network. The network is for coupling from a pair of transmitters to an output port and includes switching means making all the power from one transmitter available at the output port when the other transmitter fails. Further, the network of this invention operates in a fail-safe manner so that when a transmitter fails and there is a further failure of a switching means at least a portion of the available power from the operating transmitter is delivered to the output port. The portion that is delivered to the output port under this condition is preferably one-half of the available power from the operating transmitter.

PRIOR ART

FIG. 1 shows a conventional prior art switching circuit which may be in waveguide construction but is depicted only schematically in FIG. 1. The transmitters A and B couple to waveguide switches S1 and S2, respectively. Each of these switches are conventional waveguide switches providing single pole, double throw action. In the position shown in FIG. 1 the switches S1 and S2 couple the transmitters A and B respectively to the hybrid junction coupler J which has two inputs labeled A and B, a terminating output and an output labeled A+B. The network shown in FIG. 1 also includes an output switch S3 which is a conventional waveguide switch providing single pole triple throw action so as to connect any one of three signal paths to the output port. In the position shown in FIG. 1 the switch S3 is connected to the summing output of the hybrid junction coupler J.

When the network of FIG. 1 is operating properly, if the transmitter A, for example, fails, then switches S2 and S3 are operated so that the output from transmitter B couples to the output port. Similarly, if transmitter B fails, switches S1 and S3 are operated so that the output from transmitter A couples by way of switches S1 and S3 to the output port. The problem with the network of FIG. 1 is that the network is not fail-safe. For example, if the transmitter B fails the network requires both switches S1 and S3 to change position. If either of these switches does not operate correctly, then for example, the output switch S3 may remain connected to the hybrid J while switch S1 is connected to the side arm A which is both open circuited and unconnected to the output port. Thus, with the embodiment of FIG. 1 if there is a transmitter failure and also a switch failure, then there is no power coupled to the output port. For some critical applications this circuit is thus not useful.

SUMMARY OF THE INVENTION

Accordingly, one object of the present invention is to provide a power combining and switching network coupling from a pair of transmitters and that is operable in a fail-safe manner. In accordance with the invention, even if the switching portion of the network fails, at least a portion of the power from the operative transmitter is coupled to the output of the network.

Another object of the present invention is to provide a fail-safe power combining and switching network that is maintained matched in the normal operating mode and in failure modes.

To accomplish the foregoing and other objects of this invention there is provided a power combining and switching network which couples to a pair of transmitters identified herein as transmitters A and B. These transmitters are adjusted to have a relative phase therebetween of 90°. The network comprises first and second directional couplers which are preferably quadrature hybrids. These couplers are cascaded in series and are preferably of waveguide construction. The first coupler has a pair of input ports coupling respectively from the outputs of the transmitters while the second coupler has an output port and a termination port. Each of the couplers has a switching means associated therewith and means for selectively operating each of these switching means. Under normal operating conditions with both transmitters operative the first switching means is in a coupling state while the second switching means is in a decoupling state. With regard to the waveguide embodiment each of the couplers is a 3 db short-slot 90° coupler and the switching means are operable to permit the coupler to either operate in its normal form as a coupler or with it shorted out in the coupling region which is referred to herein as the decoupling state of the switching means.

In accordance with the invention if one of the transmitters fails, the proper switching means is operated so that all of the power in the operative transmitter is available at the output of the network. Also, the network is in a matched condition under these circumstances. Furthermore, under the condition of failure of one of the transmitters, if the switch means also fails to operate, then preferably one half of the available power from the operating transmitter is delivered to the output of the network with the network still being matched.

In the disclosed embodiment the switching means comprises a series of pins selectively moved into the slot in the coupler and solenoid means for operating these pins. In alternative embodiments other means may be used for providing reactive decoupling.

BRIEF DESCRIPTION OF THE DRAWINGS

Numerous objects, features and advantages of the invention should now become apparent upon a reading of the following detailed description taken in conjunction with the accompanying drawings in which.

DETAILED DESCRIPTION

The network of the present invention is for combining the power from two transmitters A and B so that the power at an output port of the network is the sum of the power from both transmitters (A+B). The objective of the present invention is to provide a network which permits this combining and further provides at least a portion, which is preferably half, of the power from one of the transmitters under failures of one of the transmitters and failure of the switching means associated with the network. If transmitter A fails a switching means is operated so that all of the power in transmitter B is available at the output port. Similarly, if transmitter B fails a second switching means is operated so that all of the power from transmitter A is available at the output port. With failure of either transmitter the circuit remains matched. With failure of either transmitter and also failure of operation of the switching means that is to operate, then half of the available power from the operating transmitter is delivered to the the output port with the circuit still remaining matched.

Figure 1:
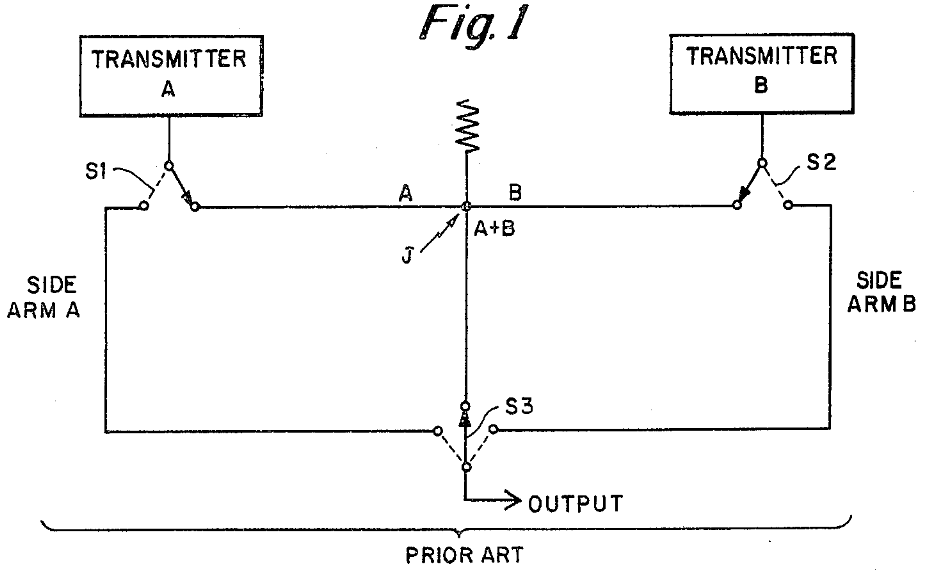
FIG. 1 is a schematic diagram of a conventional prior art circuit for combining the output from two transmitters.
Figure 2:
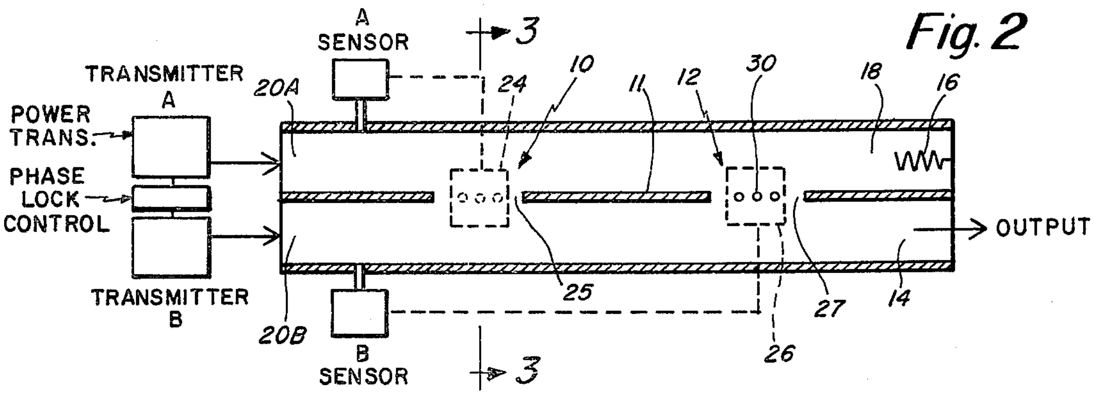
FIG. 2 is a block diagram partially in cross section of a waveguide version of the network of this invention including a pair of directional couplers.
Figure 3:
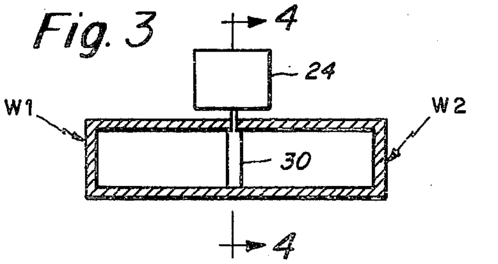
FIG. 3 is a cross-sectional view taken along line 3—3 of FIG. 2.

FIG. 2 shows a network of the present invention in waveguide construction, it being understood that other embodiments of the network can be constructed in coax, stripline or microstrip. The waveguide construction in FIG. 2 is shown in cross-section and in addition, there is shown in schematic fashion transmitter A, transmitter B, sensor A, and sensor B. As shown in FIG. 3 the waveguide construction is formed of side-by-side waveguide sections W1 and W2. Each of the waveguide sections may be in the form of a conventional WR-90 guide. The central wall 11 of the waveguide construction is slotted and, as shown in FIG. 2, there are defined tow 3 db short-slot 90° couplers (hybrids) 10 and 12 which are arranged in cascade.

The transmitters A and B are of conventional design and in the arrangement of FIG. 2 are operated to provide a combined power output at the output port 14 of the network. A termination 16 is provided at the other output port 18. The termination 16 is a conventional termination which may be a ceramic wedge termination to provide proper matching for the network. The transmitters A and B have their outputs coupled respectively to the input ports 20A and 20B of the waveguide network. Sensors A and B have sensing ports coupling to the input ports 20A and 20B respectively for sensing the operability of the associated transmitters. These sensors are of conventional design and may essentially tap off a very low percentage of the overall power to determine operability of the associated transmitter. In addition, in a complete system there are also sensors associated with the transmitters themselves to determine the operability thereof.

Figure 4:
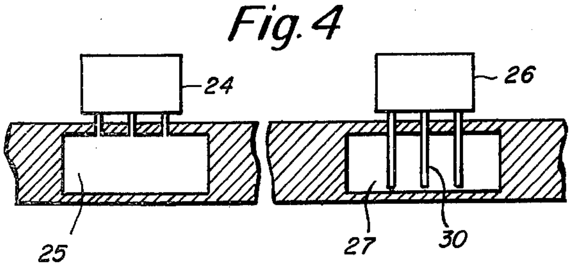
FIG. 4 is a cross-sectional view taken along line 4—4 of FIG. 3.

FIGS. 2–4 also show the switching means associated with the hybrids 10 and 12. The switching means comprise solenoids 24 and 26 associated respectively with slots 25 and 27. Each of the solenoids has a series of pins 30 associated therewith for shorting our or decoupling the slot region of the each of the hybrids 10 and 12.

Under normal operating conditions with both transmitters operative the switching means are in the position shown in FIG. 2. The hybrid 10 is operational with its coupling slot 25 open whereas the hybrid 12 is shorted out or decoupled by means of the posts 30 in the slot 27. Thus, in the normal operating condition the solenoid 24 may be considered as de-energized with its pins out of the slot 25 while the solenoid 26 may be considered as energized with its pins 30 within the slot 27 to provide a shorting out in the coupling slot region. In this condition the waveguide structure is essentially the equivalent of a 3db short-slot coupler providing output power A + B.

In the preferred construction the transmitters A and B have equal output power and in order to provide the proper matching and output power the phase relationship between the transmitters A and B is adjusted to have a 90° phase difference therebetween. With both transmitters operating and the switching means in the position shown in FIG. 2 and with the further phasing relationship between the transmitters then all the power appears at the output port 14. The output power is thus A+B.

Figure 5:
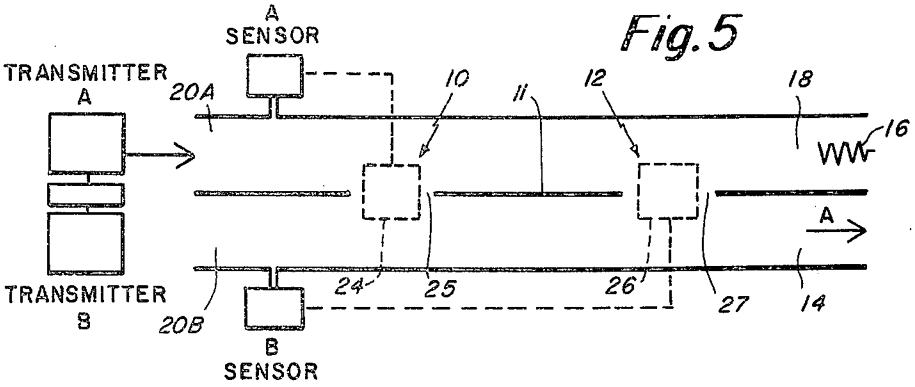
FIG. 5 is a diagram similar to the one shown in FIG. 2 under a fault condition of one of the transmitters.

FIG. 5 shows one of the failure conditions wherein transmitter B has failed to operate or where its output power has fallen below a determined allowed power level. Sensor B detects this failure and operates the solenoid 26 to its de-energized state. FIG. 2 shows the dotted control line between the sensor B and solenoid 26. Similarly, there is a dotted control line between the sensor A and solenoid 24 to be discussed hereinafter. FIG. 5 shows the resulting construction when both of the hybrids are operational. The hybrids actually form a receive duplexer or a crossover coupler which provides all the power from transmitter A at the output port 14. With this arrangement the energy essentially crosses over with all of the power from transmitter A being provided at the output port. Also, the network remains matched under that operating condition.

Figure 6:
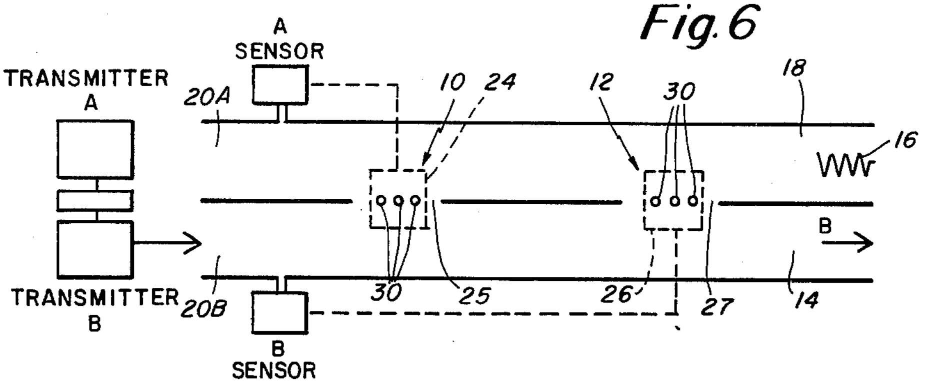
FIG. 6 is a diagram similar to the one shown in FIGS. 2 and 5 showing a fault condition for inoperation of the other transmitter.

FIG. 6 shows the opposite failure condition wherein transmitter A has failed but transmitter B is operative. In this condition the switch means associated with hybrid 12 is maintained in its original position as shown in FIG. 2 but the switch means associated with hybrid 10 is activated. The sensor A detects the loss of power from transmitter A and operates solenoid 24 to its energized state so that both slots 25 and 27 are now decoupled or shorted out in their coupling region. Under this condition the network functions as a single waveguide length with all of the power from transmitter B being coupled directly to the output port 14.

Figure 7:
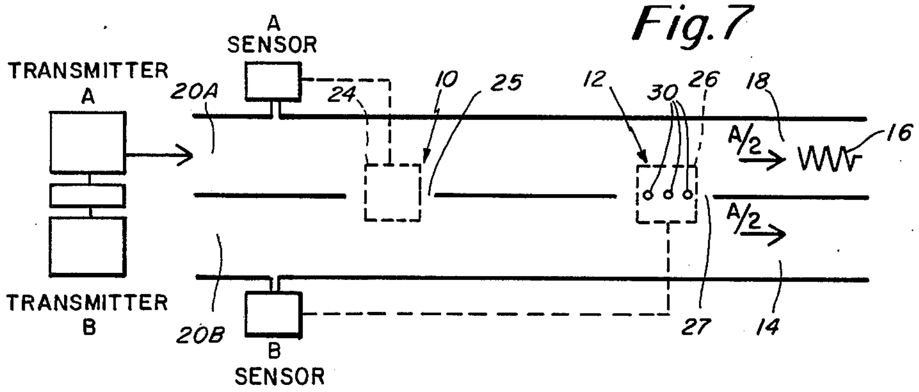
FIG. 7 is a diagram similar to that shown in FIG. 2 wherein one of the transmitters has failed and there is a further fault condition of the switch means.

FIG. 7 shows a failure condition wherein transmitter B has failed to operate, transmitter A is operating properly but the switch means associated with hybrid 12 has failed to operate. Under the condition of failure of transmitter B the network should have been in the condition shown in FIG. 5 but due to the fault of the switch means of hybrid 12 the posts 30 are still shorting out the coupling region of hybrid 12. However, half of the power from transismitter A is transmitted to the output port 14, the other half of the power being absorbed in the termination 16. Also, with the network arrangement of FIG. 7 the network is still perfectly matched.

In an analogous situation if transmitter A has failed and the switch means associated with hybrid 10 has malfunctioned, then half of the power is still coupled to the output. Under this operating condition the network should have assumed the position shown in FIG. 6 but instead the hybrid 10 remains coupled while the hybrid 12 remains decoupled thereby providing half the transmitter power at the output port.

There are other theoretically possible failure modes but these other failure modes are virtually impossible to occur. For example, if transmitter B fails, the second switch means malfunctions, and the first switch means operates when it is not energized all of the power from the transmitter A is switched to the termination and not to the output port. It is difficult to imagine how this sequence could occur in that the wrong switch means would have to be energized. Further, sensors could be provided in various places of the waveguide network to monitor the power levels and could detect any other such unlikely conditions to either cure the condition or provide a signal to shut down the system until the error can be corrected.

Having described one embodiment of the present invention it should be apparent to those skilled in the art that numerous other embodiments exist which are contemplated as falling within the scope of this invention. For example, the network of this invention may be constructed in other forms such as in a coax or stripline form. The switch means associated with each coupler may also be of many different forms. In the disclosed embodiment pins have been shown. However, vanes could be used, or a semi-conductor slab, or an electron beam may be established such as by using a gaseous discharge tube. Essentially any means may be used which reactively couples the junction to provide a short at the slot region with little or no insertion loss. In a preferred embodiment the transmitters A and B have equal power outputs. However, in another embodiment these transmitters may have different levels of power output in which case preferably the first coupler would be other than a 3 db coupler to compensate for the different power levels. The second coupler in such an arrangement could be a 3 db coupler.

What is claimed is:

1. A power combining and switching network for coupling to a pair of transmitters, comprising;

first and second series cascaded directional couplers, said first coupler having a pair of inputs coupling respectively to the pair of transmitters and a pair of outputs, and said second coupler having a pair of inputs coupling respectively to the pair of outputs of the first coupler and an output, said first coupler having a first switching means defining a coupling state and a decoupling state of the first coupler, said second coupler having a second switching means defining a coupling state and a decoupling state of the second coupler, means for controlling the state of said first switching means including means for determining the operability of one of said transmitters to operate said first coupler to its coupling state when said one transmitter is operative and to operate said first coupler to its decoupling state when said one transmitter is inoperative, and means for controlling the state of said second switching means including means for determining the operability of said other transmitter to operate said second switching means to its decoupling state when said other transmitter is operative and to operate said second switching means to its coupling state when said other transmitter is inoperative.

2. A network as set forth in claim 1 wherein said transmitters are equal power transmitters and said directional couplers are 3 db short-slot 90° couplers.

3. A network as set forth in claim 2 wherein said switching means each comprise means for shorting the coupling slot region of the coupler.

4. A network as set forth in claim 1 wherein when one of the transmitters fails and one of said switching means fails, a portion of the power from the operating transmitter is coupled to the output.

* * * * *